United States Patent [19]

Mann et al.

[11] Patent Number: 4,471,492

[45] Date of Patent: Sep. 11, 1984

[54] VOLTAGE INDICATING ARRANGEMENT FOR A RADIO TRANSCEIVER

[75] Inventors: Friedrich H. Mann, Lynchburg; Ralph R. Sherman, Forest, both of Va.

[73] Assignee: General Electric Company, Lynchburg, Va.

[21] Appl. No.: 438,155

[22] Filed: Nov. 1, 1982

[51] Int. Cl.³ .................. H04B 1/38; G08B 21/00; G01R 19/16

[52] U.S. Cl. .................... 455/73; 455/127; 455/343; 340/636

[58] Field of Search ............. 455/73, 78, 115, 127, 455/343; 340/636, 663

[56] References Cited

U.S. PATENT DOCUMENTS

| | | | |
|---|---|---|---|
| 3,500,458 | 3/1970 | Cannalte | 455/127 |
| 3,500,459 | 3/1970 | Battin et al. | 455/78 |
| 3,646,191 | 9/1969 | Russell, Jr. et al. | 455/78 |
| 3,877,001 | 4/1975 | Bogut et al. | 455/127 |
| 4,162,479 | 7/1979 | Nickell et al. | 340/636 |
| 4,356,481 | 10/1982 | Kuki | 340/636 |

*Primary Examiner*—Jin F. Ng
*Attorney, Agent, or Firm*—James J. Williams; Michael Masnik

[57] ABSTRACT

Radio transceivers are provided with a timing circuit that ends or terminates a radio transmission after a first time period, and an audible indication signals the end of the first time period. A battery voltage sensor reduces the period of the timing circuit in response to low battery voltage. Shorter period transmissions are still permitted for emergencies, and an audible indication is provided after the short time period to indicate low battery voltage.

15 Claims, 1 Drawing Figure

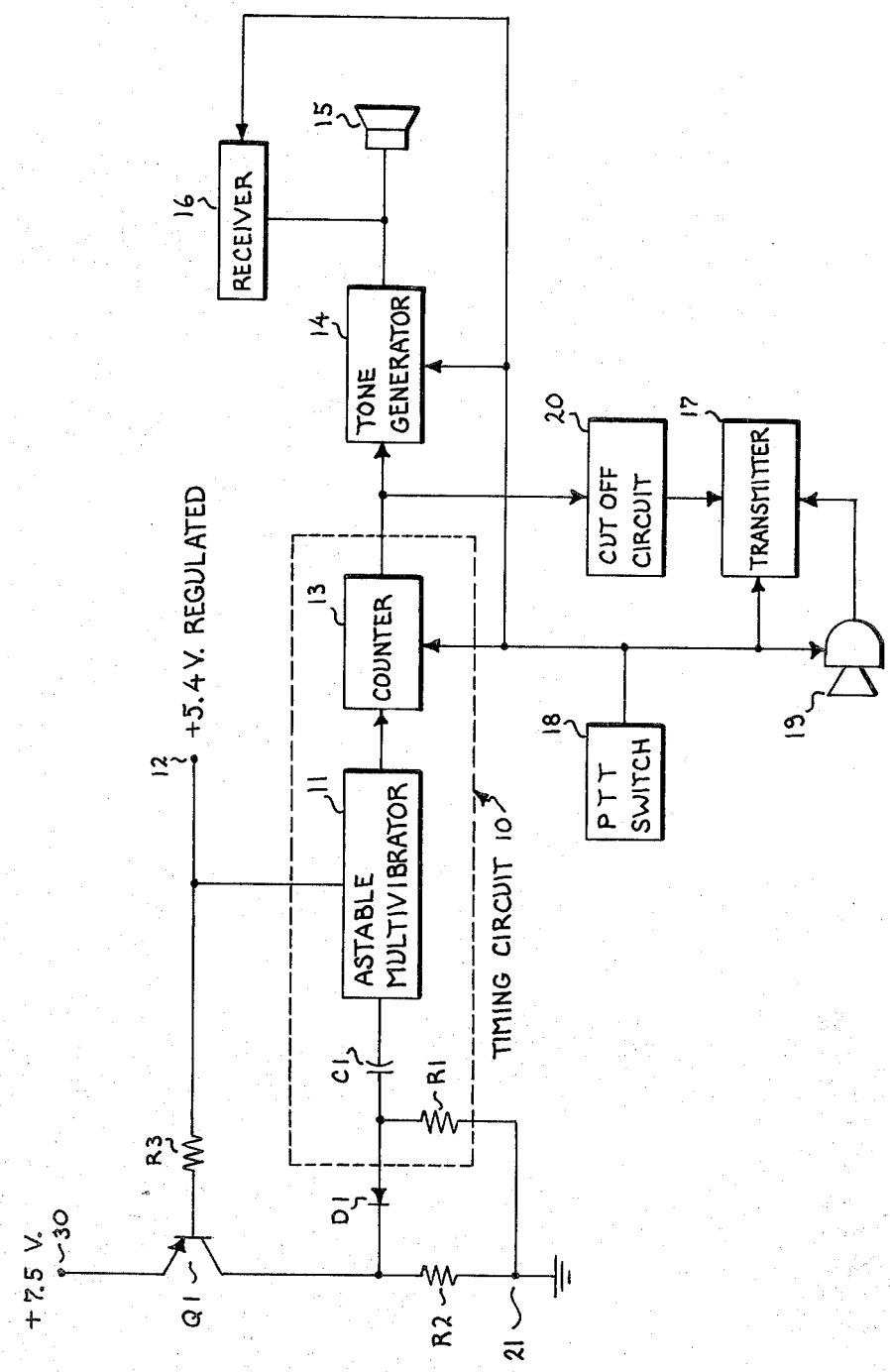

VOLTAGE INDICATING ARRANGEMENT FOR A RADIO TRANSCEIVER

BACKGROUND OF THE INVENTION

Our invention relates to a voltage indicating arrangement, and particularly to such an arrangement that provides an indication to the user of a radio transceiver that the supply voltage is low, and that also permits the radio transmitter to be operated for a short time duration.

In battery powered radio transceivers, such as hand-held or personal radios, the battery which powers the transceiver may become discharged to a level where its low voltage may degrade normal voice transmissions. Or, even worse, the voltage level may drop to the point where the system voltage regulator becomes inoperable, with the result that the frequency of the radio transmitter may drift unacceptably. Frequently, the user of the radio transceiver is not aware of this condition, because the battery voltage may still be sufficient to enable the radio receiver to provide good reception, or to enable the radio transmitter to provide enough power to communicate.

In prior arrangements, there have been visual indications of a low transceiver battery voltage. In such arrangements, an indicator lamp may provide an intensity or may blink at a rate which is related to the voltage of the battery. However, the user may not notice the indicator lamp, or the indicator may be burned out. In such cases, the user will not be aware of the low battery voltage and resultant poor performance of the transceiver. Accordingly, there is a need for a reliable indicator that informs a user of the condition of the battery voltage, particularly for a radio transceiver.

SUMMARY OF THE INVENTION

Briefly, in accordance with our invention, we utilize a timing circuit for producing an output after a first timing period following actuation of the radio transmitter. Such a timing circuit is frequently already provided in prior art radio transceivers to limit the period of transmission. In accordance with our invention, we provide the timing circuit with an input for selectively reducing the first timing period. A voltage sensing circuit is coupled to the transceiver battery circuit to produce a low voltage signal in response to the battery voltage falling below a selected magnitude. This sensing circuit is coupled to the timing circuit input, and when the low voltage signal is produced, the timing period is reduced. At the end of the reduced timing period, an output is produced. This output can be used with audible equipment already present in the transceiver to indicate to the user that the battery voltage is low. This output also limits the transmission to a shorter timing period, thus permitting the user to operate his transmitter for a short time, such as for an emergency or identification.

BRIEF DESCRIPTION OF THE DRAWING

The subject matter which we regard as our invention is particularly pointed out and distinctly claimed in the claims. The structure and operation of our invention, as well as advantages, may be better understood from the following description given in connection with the accompanying drawing, in which:

The single FIGURE shows a diagram of a preferred embodiment of a voltage indicating arrangement in accordance with our invention.

DESCRIPTION OF THE PREFERRED EMBODIMENT

As mentioned earlier, some prior art radio transceivers are provided with a timing circuit and indicator to stop transmission and provide an indication after a predetermined time period of transmission has expired so as to permit other people with transceivers to make transmissions. Such transceivers include a receiver 16 and a transmitter 17, parts of which may be common. Typically, such a prior art transceiver includes a timing circuit 10 shown enclosed in dashed lines. Such a timing circuit may take many forms, but in the embodiment illustrated, it includes an astable or free running multivibrator 11 having a timing resistor R1 and a capacitor C1 which determine the timing period for the multivibrator 11. The multivibrator 11 is provided with a suitable regulated voltage, such as +5.4 volts for example, provided between a positive terminal 12 and a ground terminal 21. The output of the multivibrator 11 is applied to a counter 13 which counts output pulses or cycles from the multivibrator 11 and produces an output signal after a selected or predetermined count. For example, if the multivibrator 11 operated at 100 pulses per second, and if the counter 13 produced an output after a count of 3000 pulses, the timing circuit 10 would have a time period of 30 seconds. The output of the counter 13 is applied to a suitable indicator, such as a tone generator 14, to actuate the tone generator 14 when the counter 13 produces an output. The tone generator 14 supplies its output to a loudspeaker 15 to indicate to a user that the timed period has elapsed. The tone generator output may be supplied directly to the loudspeaker 15 as shown, or may use a portion of the circuit of the radio receiver 16. The receiver 16 produces information signals to the loudspeaker 15 for the user's communication. The transmitter 17 is actuated by a PTT (push-to-talk) switch 18 that turns the transmitter 17 on, and that renders a microphone 19 operable so that the user can make a transmission. The PTT switch 18 also resets the counter 13, makes the tone generator 14 responsive to an output from the counter 13, and disables the receiver 16 when the PTT switch is actuated. A cutoff circuit 20 is connected between the output of the counter 13 and a control terminal of the transmitter 17 to cut off the transmitter 17 when the counter 13 produces an output.

The circuit as described thus far is known in the art, and its operation will be explained before explaining our invention. At the beginning, we assume that the PTT switch 18 is released. This release stops the counter 13, disables the tone generator 14, cuts off the transmitter 17, and turns on the receiver 16 so that a user hears receiver signals in the loudspeaker 15. When the user makes a transmission, the PTT switch 18 is operated. This resets the counter 13, makes the tone generator 14 responsive to an output from counter 13, turns off the receiver 16, and turns on the transmitter 17. If the user holds the PTT switch 18 in the operated condition, the counter 13 will produce an output upon reaching its predetermined count of pulses from the multivibrator 11. In the example assumed above, this count requires 30 seconds. At the end of this timing period, the counter 13 produces an output which causes the cutoff circuit 20 to turn off the transmitter 17, and which causes the generator 14 to produce a tone or signal which is heard in the loudspeaker 15. Upon hearing the tone in the loudspeaker 15, the user realizes that the predetermined timing period, assumed to be 30 seconds, has been reached and that transmission has stopped. The user then releases the PTT switch 18 which turns off the tone generator 14. It also turns on the receiver 16 for listening. Transmitter 17 is already cut off. If the user desires to make an additional transmission, the PTT switch 18 can be actuated again to repeat the operation just described.

The circuit as described thus far is known in the art, and is provided with radio transceivers to limit the time of transmissions so that other transceiver users will have an opportunity to transmit. Since the circuit as described is often provided in prior art radio transceivers, we have provided an additional circuit that permits the prior art circuit to provide an indication of low battery voltage. In accordance with our invention, we provide a PNP transistor Q1 having its emitter connected to an unregulated voltage, assume in the same example to be +7.5 volts, at a terminal 30. The collector is connected through a resistor R2 to the ground terminal 21. A diode D1 has its anode connected to the upper end of the resistor R1 and its cathode connected to the upper end of the resistor R2. And finally, a current limiting resistor R3 is connected between the regulated voltage terminal 12 and the base of the transistor Q1.

In the operation of our circuit, if the unregulated voltage at the terminal 30 exceeds the regulated voltage by the emitter to base voltage drop (0.6 volt), the transistor Q1 conducts. This conduction causes the voltage at the upper end of the resistor R2 to back bias the diode D1. As a result, the resistor R2 is not connected in circuit with the multivibrator 11, and it operates at its slower rate, for example at 100 pulses per second as mentioned above. If the battery voltage should become low, and drop enough (i.e. below 6.0 volts for a regulated base voltage of 5.4 volts) to back bias the emitter base junction of the transistor Q1, the transistor Q1 will be turned off. With the transistor Q1 turned off, the upper end of the resistor R2 is very nearly or substantially at ground voltage, with the result that the diode D1 conducts to place the resistor R2 in effective parallel with the resistor R1. If the magnitude of the resistor R2 is made sufficiently small relative to the magnitude of the resistor R1, the time constant of the multivibrator 11 is reduced and the frequency of the multivibrator 11 will be increased so that the counter 13 will reach its predetermined count much more quickly. For example, the presence of the resistor R2 in the multivibrator circuit could increase the multivibrator pulse rate from 100 to 600 pulses per second. With the counter 13 requiring a count of 3000 to produce an output, it will be seen that this output will be produced in five seconds as opposed to 30 seconds if the multivibrator 11 had a pulse rate of 100 pulses per second. Thus, when the battery voltage falls below the predetermined acceptable level, the counter 13 will produce an output after five seconds of operation. This output enables the tone generator 14 to produce an audible signal, and also cuts off the transmitter 17. Thus, a user is provided with an indication that the battery voltage is low, and is provided with a shorter time period to provide a transmission. Such a transmission is desirable in emergency conditions where communication is more important than improper or off frequency operation.

While we have shown only one embodiment of our invention, persons skilled in the art will appreciate the applications for our invention and the modifications that may be made. For example, the transistor Q1 may be an NPN type transistor if appropriate voltages are provided. Various timing periods may be provided. However, it is desirable that the low voltage timing period be sufficiently short relative to the normal timing period or that the generator 14 produce a different type of sound (such as an intermittent tone) so that a user will be able to distinguish between the two periods. In addition, our invention can be used with other types of timing circuits (such as switching in a different capacitor) to provide a change in the timing circuit period in response to a detection of low voltage. And, of course, various types of voltage sensing arrangements may be used to provide this change in timing. Another modification would be to replace the timing circuit 10 with a microprocessor that receives a sensed low voltage signal from an analog to digital converter and the signal from the PTT switch 18, and that produces the two timed outputs (depending upon a low voltage or normal condition) for application to the tone generator 14, the receiver 16, and the cut off circuit 20. Therefore, while our invention has been described with reference to a particular embodiment, it is to be understood that modifications may be made without departing from the spirit of the invention or from the scope of the claims.

What we claim as new and desire to secure by Letters Patent of the United States:

1. An improved arrangement for indicating low battery voltage comprising:
    a. a timing circuit, means for actuating said timing circuit, said timing circuit producing an output after a first time following actuation by said actuating means, means coupled to said timing circuit for selectively reducing said first time to a second time;
    b. means responsive to said timing circuit output for providing an indication to a user;
    c. a voltage magnitude sensing circuit for producing a low voltage signal in response to the voltage of a battery falling below a selected magnitude;
    d. and means said means coupled to said timing circuit coupling said low voltage signal to said timing circuit for causing said timing circuit to produce said output after a second time following actuation, said second time being less than said first time, thereby indicating a low voltage battery condition to said user.

2. The improved arrangement of claim 1 wherein said indication is audible.

3. The improved arrangement of claim 1 wherein said actuating means actuating said timing circuit in response to said user operating a radio transmitter.

4. The improved arrangement of claim 3 wherein said means for providing said indication comprise a radio receiver having an audio circuit and output therefor.

5. An improved indicating circuit for a radio transmitter powered by a battery comprising:
    a. a timing circuit having a first timing element for causing said timing circuit to provide an output after a first predetermined time following activation of said timing circuit;
    b. user operable means for turning on a radio transmitter and activating said timing circuit when the operable means are operated;
    c. indicating means responsive to said timing circuit output for producing a user perceptible signal;
    d. voltage sensing means for producing a low voltage signal in response to the battery voltage for said radio transmitter falling below a predetermined magnitude;

e. and means responsive to said low voltage signal for coupling a second timing element to said timing circuit for causing said timing circuit to produce an output after a second predetermined time following activation of said timing circuit, said second predetermined time being less than said first predetermined time.

6. The improved indicating circuit of claim 5 wherein said user operable means cut off said radio transmitter when released.

7. The improved indicating circuit of claim 6 wherein said first and second timing elements are resistors, and wherein said timing circuit comprises an astable multivibrator.

8. The improved indicating circuit of claim 5 wherein said perceptible signal is audible.

9. A voltage level indicating circuit for a radio transceiver having a power source, a receiver portion with an audible output, and a transmitter portion with an audible input, said indicating circuit comprising:

a. means for sensing the voltage of said power source and producing a control signal in response to said sensed voltage being less than a selected magnitude;

b. a timing circuit having a start input for producing a time expiration signal at an output following a first predetermined time period after a start signal is applied to said start input, said timing circuit further having a control input for changing said first predetermined time period to a second predetermined time period in response to said control signal applied to said control input;

c. user actuable means for operating said transmitter portion and said receiver portion;

d. means responsive to said user actuable means for supplying said start signal to said start input;

e. means responsive to said time expiration signal for preventing said transmitter portion from operating;

f. and means responsive to said time expiration signal for causing said receiver portion to produce an alert output indicating the voltage level of said power source.

10. The voltage indicating circuit of claim 9 wherein said second predetermined time period is less than said first predetermined time period.

11. The voltage indicating circuit of claim 10 wherein said alert output is an audible tone.

12. The voltage indicating circuit of claim 10 wherein said timing circuit includes an oscillator whose frequency is varied in response to said control signal.

13. The voltage indicating circuit of claim 12 wherein said transmitter portion is operated in response to said start signal.

14. The voltage indicating circuit of claim 12 wherein said alert output is an audible tone.

15. The voltage indicating circuit of claim 9 wherein said alert output is an audible tone.

* * * * *

UNITED STATES PATENT AND TRADEMARK OFFICE
CERTIFICATE OF CORRECTION

PATENT NO. : 4,471,492

DATED : Friedrich H. Mann, Ralph R. Sherman

INVENTOR(S) : Sept. 11, 1984

It is certified that error appears in the above-identified patent and that said Letters Patent is hereby corrected as shown below:

Col. 3, line 20, cancel "assume" and insert -- assumed --
Col. 4, line 41, cancel "means" (first occurrence)

Signed and Sealed this

Second Day of April 1985

[SEAL]

Attest:

DONALD J. QUIGG

Attesting Officer       Acting Commissioner of Patents and Trademarks